United States Patent
Sreeram et al.

(12)

(10) Patent No.: US 6,286,204 B1
(45) Date of Patent: *Sep. 11, 2001

(54) METHOD FOR FABRICATING DOUBLE SIDED CERAMIC CIRCUIT BOARDS USING A TITANIUM SUPPORT SUBSTRATE

(75) Inventors: Attiganal Narayanaswamy Sreeram, Plainsboro; Ashok Narayan Prabhu, East Windsor; Leszek Hozer, Lawrenceville; Kalipada Palit, Plainsboro, all of NJ (US)

(73) Assignee: Sarnoff Corporation, Princeton, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/264,651

(22) Filed: Mar. 8, 1999

Related U.S. Application Data

(60) Provisional application No. 60/077,367, filed on Mar. 9, 1998.

(51) Int. Cl.$^7$ ....................................................... H01K 3/10
(52) U.S. Cl. .................................. 29/825; 29/830; 427/97
(58) Field of Search ........................ 29/830, 852; 427/97, 427/98

(56) References Cited

U.S. PATENT DOCUMENTS

| 4,313,026 | * | 1/1982 | Yamada et al. ........................ 174/68.5 |
| 4,528,072 | * | 7/1985 | Kurosawa et al. ....................... 29/830 |
| 4,725,333 | | 2/1988 | Leedecke et al. ..................... 156/630 |
| 5,224,265 | | 7/1993 | Dux et al. ............................... 29/852 |
| 5,264,758 | * | 11/1993 | Iijima et al. ........................... 313/584 |
| 5,277,724 | * | 1/1994 | Prabhu .................................... 156/89 |
| 5,565,262 | * | 10/1996 | Azzaro et al. ......................... 428/210 |
| 5,681,444 | * | 10/1997 | Azzaro et al. ......................... 205/125 |
| 5,747,931 | | 5/1998 | Riddle et al. .......................... 313/581 |
| 5,880,705 | * | 3/1999 | Onyskevych et al. .................. 345/80 |

FOREIGN PATENT DOCUMENTS

96/22881    8/1996 (WO) .

* cited by examiner

*Primary Examiner*—Lee Young
*Assistant Examiner*—Rick Kiltae Chang
(74) *Attorney, Agent, or Firm*—William J. Burke

(57) ABSTRACT

An integrated double sided metal supported display device has a green tape stack on both sides of the metal support. The green tape stacks incorporate circuitry and conductor filled vias to access the circuitry electrically on each green tape layer. The metal support has a plurality of openings to access both of the green tape stacks. These openings are made by forming the openings in the metal support, filling them with a dielectric that has a thermal coefficient of expansion close to that of the metal support, forming an opening in the dielectric and filling the opening with a conductive ink.

5 Claims, 1 Drawing Sheet

METHOD FOR FABRICATING DOUBLE SIDED CERAMIC CIRCUIT BOARDS USING A TITANIUM SUPPORT SUBSTRATE

This application claims the priority date of Provisional application Ser. No. 60/077,367 filed on Mar. 9, 1998.

This invention relates to an improved method for making plasma display devices. More particularly, this invention relates to a method for making double-sided metal supported plasma display devices.

BACKGROUND OF THE INVENTION

Plasma display devices include a front panel and a back panel, both typically made of inexpensive float or sodalime window glass. Electrical connections and structures are formed on one or both of the panels. For example, the back panel may have a ribbed structure so that the space between these ribs defines a pixel or column of pixels. Plasma displays operate by selectively exciting an array of glow discharges in a confined noble gas mixture, such as He-Xe or Ne-Xe gas mixtures, to produce UV light. Full color displays are made by depositing alternating blue, green and red phosphors in the pixel cells. The phosphors in each pixel cell are excited by the UV light and emit light of the desired color at each pixel position.

The plasma display back panel further has a plurality of parallel, spaced, column electrodes on a surface, with the barrier ribs projecting above and between the column electrodes. The column electrodes required for the display devices are deposited onto a green tape. A plurality of green tapes can also be embossed to form the rib structures on which the phosphors can be deposited to form the pixels. Vias can also be formed in the green tapes by filling them with a conductor ink which provides an electrical connection between the circuits and electronics on the various green tape layers. Drive electronics for the pixels are mounted along the edges of the display. The barrier ribs can also act as spacers between the back panel and a front panel. In a typical display, the barrier ribs are 0.1 to 0.2 mm in height, 0.03 to 0.2 mm wide and have a pitch of 0.1 to 1.0 mm. A support plate underlies the display and provides additional mechanical strength. The support plate can be made of metal, e.g., titanium.

The front panel also includes an array of parallel spaced row electrodes orthogonal to the column electrodes. A layer of glass covers the row electrodes, and a layer of MgO covers the glass layer. A glass frit is used to form a vacuum-tight seal between the front and back panels of the display, confining the noble gases inside the display.

Voltages are selectively applied to the electrodes to excite, maintain and extinguish a plasma in the gas between the barrier ribs. Green tape layers and embedded circuitry are made from materials that, after densification into ceramics, have a thermal coefficient of expansion (hereinafter TCE) that is matched to that of the metal support. The TCE of the ceramic/metal composite matches that of the front panel.

A prior art metal supported plasma display device is illustrated in FIG. 1.

FIG. 1 is a cut-away side plan view taken along a line of a row electrode of the display. The display includes a back panel 10 which includes a metal support sheet 12 and a laminated and embossed green tape stack structure 14 which includes circuitry and which, when embossed, forms the barrier ribs 16 for the display. Embedded in the green tape structure 14 are the column electrodes 20. Above each electrode 20, on the surface of the embossed region of the green tape stack 14, are the alternating phosphors 18 which are excited selectively to emit red, green or blue light. A glass frit seal 24 seals the front glass panel 22 to the back panel 10. Drive electronics 26 drive the display.

In making plasma display devices, it would be desirable to be able to mount the electronic devices needed to address the pixels and to drive the display on the same support board. Unless there is already sufficient space on the sides of the display, in order to do this, a second set of green tape layers would need to be adhered to the backside surface of the metal support board. These green tapes would carry or embed the various interconnects and electronic devices required, solderable pads and the like. In such case, a plurality of feedthrough holes would also need to be made in the support board and filled with a conductive material to permit electrical connections to the circuits and interconnects of the green tapes on both sides of the board. The conductors in the feedthrough holes must be electrically insulated, as with a dielectric material, from the metal plate.

In the past, openings or holes were drilled in the metal support board. A layer of a dielectric was applied to line the openings, and then fired. These dielectric lined openings were then filled with a conductor ink, and fired again. Thus multiple firing steps were employed to form the required conductive feedthrough holes.

It would be desirable to be able to make integrated double sided metal supported display devices using fewer manufacturing steps.

SUMMARY OF THE INVENTION

We have found a process whereby after forming openings in a metal support substrate, the openings are completely filled with a dielectric plug. A hole is then formed in the plug, and the hole is filled with a conductor ink composition. This method reduces the number of firing steps required to make double sided metal supported display devices.

DETAILED DESCRIPTION OF THE INVENTION

Figure 2:
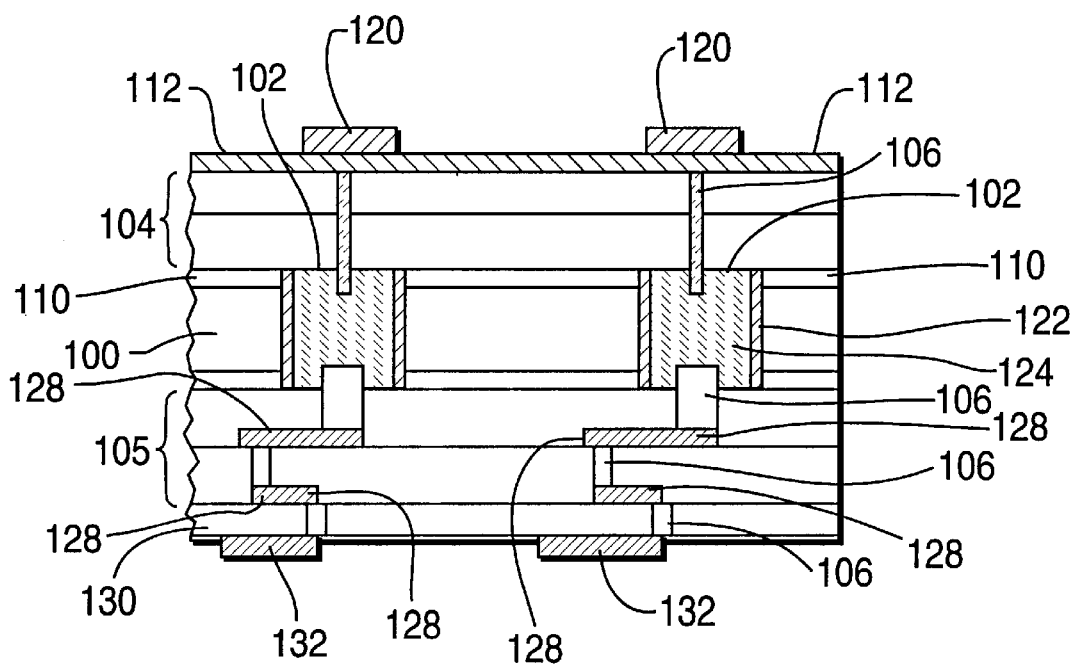
FIG. 2 is a cross sectional view of an integrated flat panel plasma display device having circuitry on both sides of a metal core support substrate made in accordance with the invention.

The invention will be described by referring to FIG. 2, which illustrates a typical integrated double sided metal supported plasma display device made in accordance with the invention.

The metal plate or support illustrated herein is titanium. Other metals can be used, but the composition of the glasses and conductor inks illustrated herein to make the display may require modification so that the TCE of the glasses and inks matches that of the metal support, and so that adhesion requirements between the metal core and the various materials that are co-fired thereto are satisfied. Thus the glasses and ink compositions described herein are chosen to have a TCE matched to that of titanium.

Suitable titanium sheets are available as commercially pure ASTM Grade 2 titanium sheet having a thickness of from about 0.005 to 0.040 inch. For a titanium test sheet 3 inches square, about 200 openings or feedthrough holes were made in the titanium sheet.

The invention will be explained referring to FIG. 2.

Both surfaces of the titanium sheet support 100 are coated with a low firing temperature glaze 110 to ensure good adhesion between the titanium support 100 and other materials it is contacted to. A suitable bonding glaze layer 110 is made of a lead-based glass that will melt at temperatures of about 350–600° C. in air. A commercially available lead glaze, Hommel F-92 of O'Hommel Co. is suitable, although other suitable low melt temperature glaze materials are known and can be substituted.

In accordance with the invention, suitable feedthrough hole openings 102 are formed in the titanium support 100 by punching, drilling or, preferably by etching the feedthrough openings 102 in the support 100.

The feedthrough openings 102 are first completely filled with a dielectric plug 122 to isolate the feedthrough holes 102 from the titanium support 100. The dielectric plug or insulator material 122 suitably is a green tape composition formed from a suitable glass composition as set forth below, one having a TCE matched to titanium and mixed with a solvent mixture. Such an insulator or dielectric composition can be made from 30–31 parts by weight of the glass, 1.91–2.91 parts of forsterite filler, 15.0 parts of a resin mixture and 1.0 part of a mixture of equal parts of a solvent mixture of lecithin and terpineol. This insulator composition can be screen printed onto the titanium, or an insulating tape can be made from the composition and forced into the feedthrough openings 102.

After filling the feedthrough openings 102 with the dielectric plug 122, a hole is drilled or punched through the dielectric filling 122 to provide openings in the dielectric layer 122. These openings are then filled with a feedthrough conductor ink 124 to provide an electrical connection to the circuitry on both sides of the titanium support 100.

This feedthrough conductor ink 124 must have good filling characteristics, i.e., be viscous enough to fill the openings without voids, and be able to withstand a firing step without shrinking away from the dielectric 122 lining the openings, or shrinking away from subsequently applied green tape stacks. Thus the shrinkage in the z direction must be minimized so as to produce a void-free feedthrough connection to the circuitry on both sides of the metal support 100.

A first green tape stack 104 having conductive vias 106 therein, are made from one or more glasses chosen to have, after firing, a TCE matched to that of titanium. A bonding glaze layer 110 ensures that, after firing, good adhesion between the glazed support 100 and the green tape stacks 104 and 105 is obtained.

The first green tape stack 104 has screen printed circuitry on its surface layers (not shown). The green tape stack 105 further includes embedded interconnects 128 connected to conductive vias 106. The vias 106 are filled with a conductor to electrically connect the circuits on the green tapes to each other and to the conductors in the titanium support 100. The green tape stacks 104 and 105 are laminated under heat and pressure in known manner and aligned with the titanium support 100.

A suitable green tape composition useful herein comprises 92–95 parts by weight of a Zn—Mg-borosilicate glass. This glass includes, in percent by weight, 20–40% of zinc oxide, 15–35% of MgO, 15–30% of boron oxide and 15–30% of silicon oxide. A preferred glass contains about 30 parts by weight of ZnO, 25 parts by weight of MgO, about 20 parts by weight of boron oxide and about 25 parts by weight of silicon oxide. A small amount, about 5–8 parts by weight, of a filler such as forsterite can be added also. The oxides are melted together and then ball milled to obtain finely divided glass particles.

The glass particles are admixed with a suitable organic vehicle, which can include a resin mixture and a solvent. The solvent, present at about 19.5 parts by weight, can be made from 846 parts of methyl ethyl ketone, 846 parts of ethanol and 112.5 parts of fish oil. The resin mixture, present in about 22.5 parts by weight, can be made from 620 parts each of methyl ethyl ketone and ethanol, 192 parts of Santicizer #160 available from Monsanto Corporation and 288 parts of Butvar B98 resin, also available from Monsanto Corporation. This composition is cast into green tape and cut into suitable sheets in known manner.

In order to connect the green tape circuits electrically, via holes are punched into the green tapes and filled with a via fill ink. This via fill ink can be the same as the conductor ink for filling openings formed in the titanium support, but other suitable via fill inks are known and can be substituted.

For example, a suitable via fill conductor ink comprises 23.34–23.50 parts by weight of silver powder available as "EG" from the Degussa Corporation, to which is added 9.32 to 9.50 parts by weight of a lead aluminosilicate glass having a particle size of about 4.0 microns. A suitable glass is made from about 50% of lead oxide, about 40% of silica and about 10% of alumina. A resin binder solvent mixture is made with 0.48 parts by weight of Hypermer PS2, a solvent available from ICI America Inc., 3.64 parts by weight of 8% ethyl cellulose binder having a molecular weight of 300 in butyl carbitol, 2.96 parts by weight of 25% Elvacite 2045 acrylic binder available from ICI Acrylics in terpineol; 1.48 parts by weight of Santicizer #160 and 0.58 part by weight of thixatrol, commercially available from RHEOX Company. This ink can be screen printed into via holes and the titanium board feedthrough openings.

Circuitry is applied to the surface of each green tape by screen printing a conductor ink thereon. Suitable surface conductor inks include from 23–25 parts by weight of a silver-palladium powder; from 3.88–4 parts by weight of a glass powder having a particle size of about 6 microns of a zinc-aluminosilicate glass. This glass comprises 35–50% of ZnO, 5–15% of alumina and 30–50% of silica. A preferred glass includes about 45.43% by weight of ZnO, about 11.38% by weight of alumina and about 43.19% by weight of silica. A like amount of a panel glass powder having a particle size of about 3 microns is also added such as #9061 Corning panel glass of Corning-Asahi Co. A small amount of copper powder can also be added, suitably about 0.18–0.22 parts by weight of Metz copper 10 available from the Degussa Corporation.

The glass and metal powders are ground and an organic vehicle comprising, in parts by weight, 9.4 parts of ethyl cellulose having a molecular weight of 300, 18.8 parts of ethyl cellulose having a molecular weight of 14, 133 parts of butyl carbitol and 88.8 parts of dodecanol. This conductor ink is mixed and screen printed onto green tapes. A plurality of the green tapes having the desired circuitry thereon are aligned and laminated together in conventional manner under heat and pressure.

After assembling the titanium support 100 prepared as above and the green tape stacks 104 and 105, the co-laminated stack is fired at a temperature up to about 750–900° C., suitably in a belt furnace. After cooling, the top side of the titanium supported panel structure can be glazed to provide a very smooth surface. A commercially available glaze, NP7972, available from Noritake Co., Ltd. Japan, is suitable. This thin glaze layer 112 is post fired at about 550° C. in air. However, higher firing temperature glazes can be used if desired. Pixel elements 120 are formed over the green tape stack 104 and the glaze layer 112.

The conductor paths 106 on the backside of the titanium board 100 are distributed by means of buried interconnects 128 between green tape layers. These interconnects are made by screen printing a buried conductor ink using a suitable mask onto the green tapes that form the stack 105. A suitable buried conductor ink comprises 60 to 62 parts by weight of EG silver powder, 0.5–0.6 parts by weight of Metz copper 10, 12 parts by weight of the resin mixture used to make the surface conductor ink described above, and 0.9 part by weight of a 50:50 weight percent mixture of lecithin and terpineol.

The green tape layers 105 are laminated and aligned to the metal support board 100 and the whole structure is fired, generally at a temperature of about 750–950° C.

The bottom surface of the fired green tape 105 can be coated with conductive pads 130 to which various electronic components 132 can be attached, as by soldering.

Figure 1:
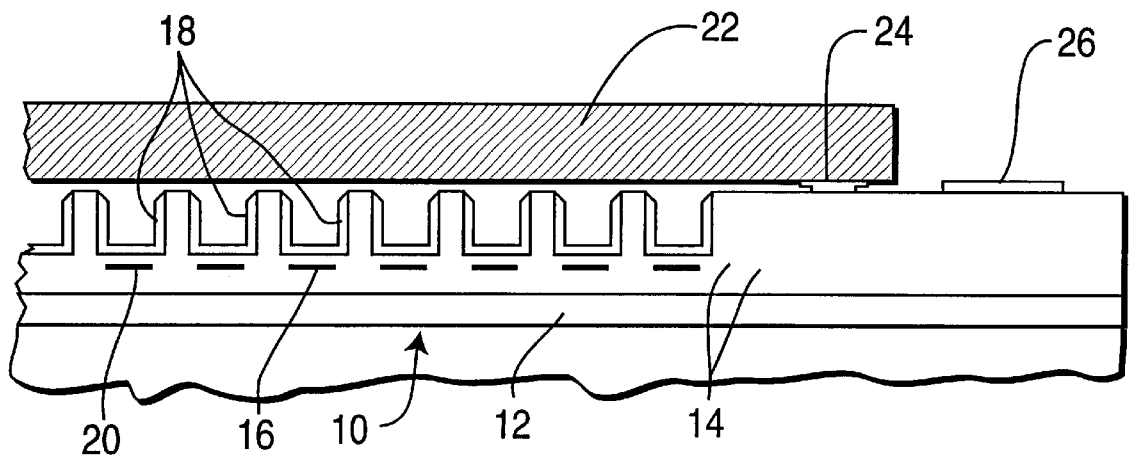
FIG. 1 is a side plan cut-away view taken along one row of a prior art plasma display device.

The plasma display device is finally assembled by glass frit sealing the double sided titanium supported back panel to a front panel shown as 22 in FIG. 1.

Although the invention has been described in terms of specific glasses, insulator, conductor inks and glazes for a titanium support board, it will be apparent to one skilled in the art that various substitutions for these materials can be made, providing the support board and other materials are TCE matched. Thus the present invention is only meant to be limited by the scope of the appended claims.

We claim:

1. A method of forming a double sided multilayer ceramic dielectric circuit board consisting of a titanium metal support substrate, with feedthrough openings connecting the double sided multilayer circuit board, where the feedthrough openings are electrically insulated from the titanium metal substrate with a dielectric material that has a thermal coefficient of expansion matched to titanium, the method comprising a) forming feedthrough openings in the titanium metal support board,
  b) wholly filling the feedthrough openings with the dielectric material that has the thermal coefficient of expansion matched to titanium,
  c) forming an opening through the dielectric material, and
  d) filling the opening in the dielectric material with a metal conductor.

2. The method according to claim 1 wherein the dielectric material comprises a glass including about 20 to about 40 percent by weight of zinc oxide, from about 15 to about 35 percent by weight of magnesium oxide, from about 15 to about 30 percent by weight of boron oxide and from about 15 to about 30 percent by weight of silicon oxide.

3. The method according to claim 2 wherein the dielectric material is a mixture of about 30 to 31 parts by weight of the glass, about 1.9 to about 2.0 parts by weight of a forsterite filler, about 15 parts by weight of a resin mixture and about 1 part by weight of a solvent.

4. The method according to claim 1 wherein the metal conductor is a feedthrough conductor ink comprising from 23.34 to about 23.50 parts by weight of silver powder, from 9.32 to 9.50 parts by weight of a lead aluminosilicate glass comprising about 50 percent by weight of lead oxide, about 40 percent by weight of silica and about 10 percent by weight of aluminum oxide.

5. The method according to claim 1 wherein the titanium support substrate is glazed on both surfaces with a low temperature lead-based firing glass having a melting temperature of about 350–600° C. in air.

* * * * *